United States Patent [19]

Kasai et al.

[11] Patent Number: 4,883,020
[45] Date of Patent: Nov. 28, 1989

[54] APPARATUS OF METAL ORGANIC CHEMICAL VAPOR DEPOSITION FOR GROWING EPITAXIAL LAYER OF COMPOUND SEMICONDUCTOR

[75] Inventors: Kazumi Kasai, Atsugi; Hiromi Itoh, Kawasaki; Hitoshi Tanaka; Tatsuya Oh-hori, both of Sagamihara; Junji Komeno, Fujisawa, all of Japan

[73] Assignee: Fujitsu Limited, Kawasaki, Japan

[21] Appl. No.: 320,922

[22] Filed: Mar. 8, 1989

Related U.S. Application Data

[63] Continuation of Ser. No. 887,339, Jul. 21, 1986, abandoned.

[30] Foreign Application Priority Data

Jul. 19, 1985 [JP] Japan .................. 60-159849

[51] Int. Cl.$^4$ ............................................. C23C 16/00
[52] U.S. Cl. ................................... 118/719; 118/728; 118/729; 118/733; 414/217
[58] Field of Search ............... 118/719, 728, 729, 733; 414/217

[56] References Cited

U.S. PATENT DOCUMENTS

| | | | |
|---|---|---|---|
| 4,313,783 | 2/1982 | Davies | 118/731 |
| 4,433,951 | 2/1984 | Koch | 414/217 |
| 4,465,416 | 8/1984 | Burkhalter | 118/719 |
| 4,503,807 | 3/1985 | Nakayama | 118/725 |
| 4,553,069 | 11/1985 | Purser | 414/225 |
| 4,584,045 | 4/1986 | Richards | 156/643 |
| 4,592,306 | 6/1986 | Gallego | 118/719 |
| 4,592,800 | 6/1986 | Landau | 156/656 |

FOREIGN PATENT DOCUMENTS

| | | |
|---|---|---|
| 0132408 | 1/1985 | European Pat. Off. |
| 2162367A | 1/1986 | United Kingdom |

OTHER PUBLICATIONS

Rosler, Automation in CVD Processing, Solid State Technology, Jul. 1977, pp. 27-33.
Patents Abstracts of Japan, vol. 8, No. 102, (C-222) [1539], May, 12, 1984; & JP-A-59 18 195 (Nippon Denshin Denwa Kosha) 01-30-1984.
Journal of Crystal Growth, vol. 69, Nov. 1, 1984, pp. 10-14, J. A. Long et al., "Growth of Fe-Doped Semi--Insulating InP by MOCVD".
European Search Report, The Hague, 03-02-1987.

*Primary Examiner*—Richard Bueker
*Attorney, Agent, or Firm*—Staas & Halsey

[57] ABSTRACT

A transfer chamber is provided between MOCVD reaction chamber and load lock chamber, connected to each chamber through an opening for each, for preventing the reaction chamber from the invasion of foreign gases, which may oxydize metals of MOCVD. The load lock chamber can be evacuated or filled with an inert gas, and has a door to the outside for bringing semiconductor wafers in or out. The transfer chamber is provided with a gas inlet and a gas outlet, through each of them an inert gas is always fed and drained for circulation, and also provided with a transfer mechanism therein for transferring wafers between the load lock chamber and the reaction chamber. Wafers are placed on a susceptor connected to the lid, which is driven by the transfer mechanism. A liner tube for protecting the inner surface of the reaction chamber from undesirable contamination caused by MOCVD reaction may be provided detachably attached to the lid to enclose the wafer. Each opening may be provided with shutter means for sealing each opening while the opening is not sealed by the lid. Oxygen or water vapor undesirably introduced are washed away by the flow of inert gas in the transfer chamber on the way to the reaction chamber.

23 Claims, 3 Drawing Sheets

APPARATUS OF METAL ORGANIC CHEMICAL VAPOR DEPOSITION FOR GROWING EPITAXIAL LAYER OF COMPOUND SEMICONDUCTOR

This is a continuation of Ser. No. 887,339, filed 7/21/86, now abandoned.

BACKGROUND OF THE INVENTION

1. Field of the Invention

The present invention relates to an improvement of an apparatus for Metal Organic Chemical Vapor Deposition (hereinafter abbreviated to MOCVD) for epitaxial growth of compound semiconductor wafers. More particularly, the present invention relates to a MOCVD apparatus which is protected from invasion of undesirable foreign gases.

2. Description of the Related Art

In general, an epitaxial growth method for growing a semiconductor crystal layer on a semiconductor wafer is widely used as a basic technology in semiconductor devices fabrication.

There are three major classifications of the methods for epitaxial growth. These are Chemical Vapor Deposition (abbreviated to CVD), Liquid Phase Epitaxy (abbreviated to LPE) and Physical Vapor Deposition (abbreviated to PVD). Further, among the methods of above-described CVD, there is a method called MOCVD which uses a metal organic gas, such as TMA (Tri-Methyl-Aluminum) or TMG (Tri-Methyl-Gallium). In such MOCVD method, the metal organic gas, as a source of the metal, is pyrolyzed to supply metal atoms for crystal growth.

MOCVD is particularly useful for fabricating a compound semiconductor of III-V or II-VI group, such as AlGaAs (Aluminum-Gallium-Arsenide). MOCVD is effectual for growing a very thin crystal layer, a multilayer structure, or a polyatomic mixed crystal under precise control of contents and it is useful for mass production of the compound semiconductors. Thus, MOCVD has been becoming more important method in semiconductor industry than before.

However, the epitaxial layer grown in the MOCVD is susceptibly influenced by the contents of the gases in which the epitaxial growth is performed. Particularly, aluminum is most susceptible to be oxidized, being followed by antimony, indium and gallium in order. So, foreign gas containing, for example, oxygen or water vapor oxidize the metals of the epitaxy to worsen the purity of the epitaxial layer. Thus, the foreign gas invasion into the reaction chamber results in deterioration of the characteristics of the fabricated devices. Therefore, special efforts have been made to protect the reaction chamber from the invasion of undesirable foreign gases of the outside.

Among these efforts to prevent foreign gas invasion, following two major methods have been applied to MOCVD apparatus, one is using a nitrogen-gas-filled loading chamber, another is using a load lock chamber, for loading as well as unloading the semiconductor wafers into the reaction chamber.

An apparatus for the above-described first method using a nitrogen gas chamber is schematically illustrated in FIG. 1. The loading process of semiconductor wafer 37 into the reaction chamber 32 is as follows. The door 31c of the nitrogen gas chamber 31 is opened to input a semiconductor wafer from the open air area (referred to hereinafter as outside) into the nitrogen gas chamber 31 and place it on the susceptor 33. At this time, the susceptor 33 is positioned at the place shown by dotted lines in the nitrogen gas chamber 31. The door 31c is closed. An inert gas, for example, a clean purified nitrogen gas is always fed from a gas inlet 31a into the nitrogen gas chamber 31 and drained through a gas outlet 31b. The flow of this nitrogen gas purges undesirable foreign gases, which have been undesirably introduced into the nitrogen chamber 31 from the outside together with the wafers 37 and tools when they were inputted therein, and still staying there. The wafer 37 and its susceptor 33 are pushed into the reaction chamber 32 by a connecting rod 36. The lid 35 to which the connecting rod 36 is connected seals an opening between the reaction chamber 32 and the nitrogen chamber 31 to complete the procedure of loading the wafer. Into the reaction chamber 32, gases for reaction of MOCVD are fed from a gas inlet 32a and drained through a gas outlet 32b, while the wafer 37 together with the susceptor 33 are heated by a heating means, for example a radio frequency coil, (not shown in the figure) provided outside the reaction chamber 32. Thus, the MOCVD is performed. The procedure for unloading the wafer from the reaction chamber 32 is the reverse of above-described loading procedure.

Though foreign gases in the nitrogen gas chamber 31 have been purged to some degree by above-described nitrogen gas flow, there still may remain some foreign gases and may invade the reaction chamber 32, resulting in contamination of epitaxial layer of the wafer 37, i.e. oxidization of the metals therein.

In the second method, the load lock chamber is used as an alternative to the nitrogen gas chamber 31 for foreign gas protection. This load lock chamber is not shown by figure, but is similar to the nitrogen gas chamber 31 and provided in place of it. The load lock chamber containing wafers 37 inputted therein is evacuated to remove the gases therein before the wafer is loaded into the reaction chamber 32. This method is more effective to reduce foreign gas invasion into the reaction chamber 32 than the nitrogen gas chamber method, however, there still remain foreign gases which are adsorbed on the wafers, the tools or the walls of the load lock chamber and may then invade the reaction chamber If perfect removal of these remaining foreign gases is attempted, the load lock chamber must be evacuated in much higher vacuum or baked up to an elevated temperature, requiring more operation time and more sophisticated apparatus. Thus, quality of the semiconductor product in the prior art is not satisfactory even though the efficiency of the production is satisfactory.

Therefore, there still exists a need for a method providing more perfect protection of the reaction chamber from foreign gas invasion while consistently keeping efficient production.

SUMMARY OF THE INVENTION

It is a general object of the present invention to provide means for loading semiconductor wafers into the MOCVD reaction chamber in order to perfectly prevent an invasion of undesirable foreign gases into the reaction chamber from the outside.

It is further object of the invention to provide an efficient mass production apparatus to acquire a semiconductor device of high purity epitaxial layer of AlGaAs etc.

The present invention provides an additional chamber, namely a transfer chamber, between a load lock chamber and a reaction chamber of conventional MOCVD apparatus. Via the transfer chamber, a semiconductor wafer is loaded from the load lock chamber into the reaction chamber.

The transfer chamber is always fed and filled with a inert gas supplied from a gas inlet and drained through a gas outlet, and is never exposed to the gases of the outside. So, the atmosphere inside the transfer chamber is kept much cleaner than that of the conventional nitrogen gas chamber or load lock chamber. This flow of the inert gas washes away the adsorbed undesirable foreign gases on the wafers or tools, while they are transferred through the transfer chamber from the load lock chamber into the reaction chamber The transfer chamber is provided with transfer means, which inserts or pulls out the wafer and its supporting means into or from the load lock chamber or the reaction chamber, and transfers them between the load lock chamber and the reaction chamber. In order to achieve better isolation of adjacent chambers, there may be provided first shutter means for sealing the first opening between the transfer chamber and the load lock chamber, and/or second shutter means for sealing the second opening between the transfer chamber and the reaction chamber, while the respective opening is not sealed by the lid.

To start loading wafers into the reaction chamber, wafers are inputted from the outside into the load lock chamber through a door on a wall of the load lock chamber, and placed on a susceptor, a member of the supporting means. The door is closed and another opening leading to the transfer chamber is sealed by the lid. The load lock chamber is evacuated and filled with an inert gas thereafter. The wafer supported by the lid is pulled out into the transfer chamber.

By doing so, undesirable foreign gases remaining in the load lock chamber are not introduced into the reaction chamber together with the wafers or tools, because they were once evacuated in the load lock chamber and additionally, the foreign gases still remaining adsorbed on the wafers or tools are washed away by the fresh inert gas flowing in the transfer chamber. Thus, aluminum, for example, very susceptive to oxidization, in the grown epitaxial layer is protected from undesirable invasion of foreign gases, such as oxygen, which may oxidize the aluminum. This protection results in high quality devices made of high purity compound semiconductor of III-V or II-VI group, such as AlGaAs.

A liner tube may be provided surrounding the susceptor and the wafer thereon, to protect the inner surface of the reaction chamber from undesirable deposition of materials caused by MOCVD reaction. The liner tube is detachably attached to the lid at an end of the tube. Therefore, the liner tube is moved together with the lid. The liner tube is designed that the top end of the liner tube reaches the end wall of the reaction chamber when the liner tube is completely inserted into the reaction chamber, so that a gas inlet located on this end wall can feed the MOCVD reaction gases into inside the liner tube. On the liner tube, near the lid and close to the gas outlet of the reaction chamber, there is provided a hole through which the fed reaction gases are drained. Thus, most of the undesirable MOCVD deposits is made on the inner surface of the liner tube, which is easily replaceable in the load lock chamber, resulting in also keeping clean atmosphere in the reaction chamber The above-mentioned features and advantages of the present invention, together with other objects and advantages, which will become apparent, will be more fully described hereinafter.

DESCRIPTION OF PREFERRED EMBODIMENT

Figure 1:
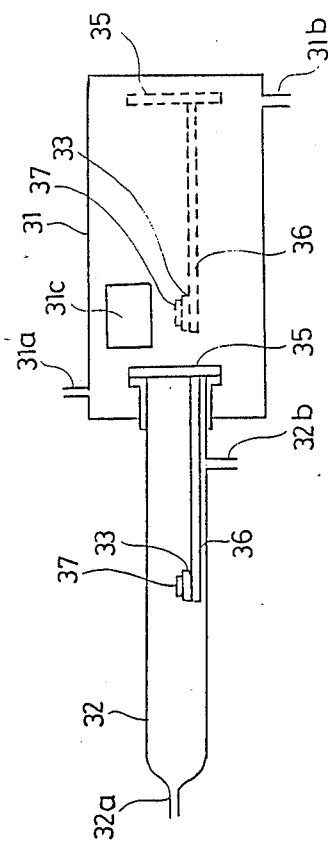
FIG. 1 is a schematic diagram of a conventional apparatus of MOCVD.
Figure 2:
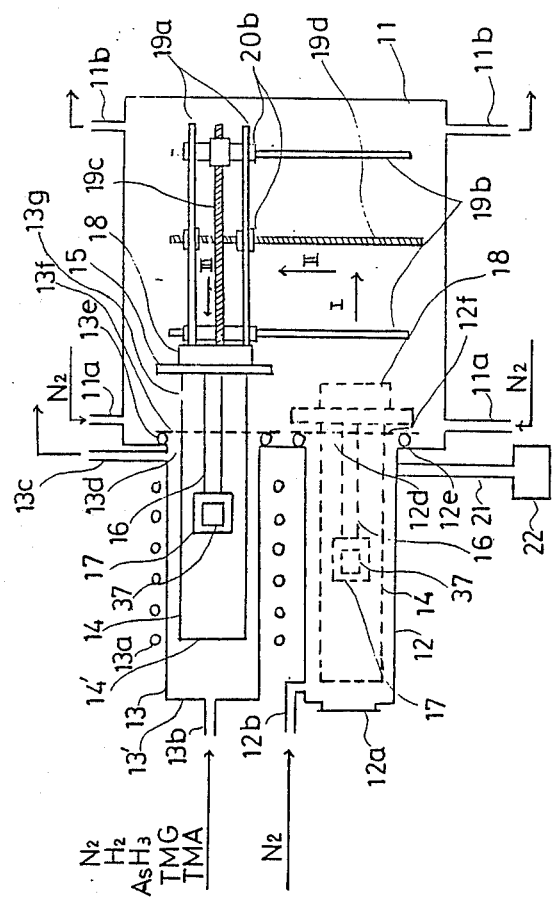
FIG. 2 schematically illustrates a plan sectional view of MOCVD apparatus according to the present invention.
Figure 3:
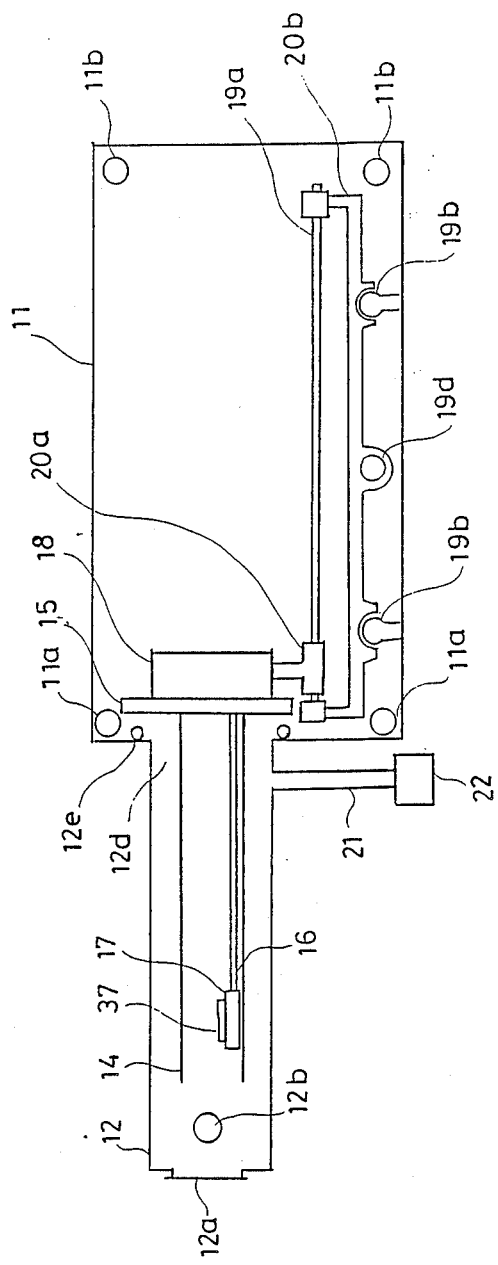
FIG. 3 schematically illustrates a vertical sectional view of a load lock chamber and a transfer chamber of FIG. 2.

FIG. 2 shows a plan view of an embodiment of the MOCVD apparatus, which is composed of a transfer chamber 11, a load lock chamber 12 and a reaction chamber 13, and in FIG. 3 there is shown a vertical sectional view of the load lock chamber 12 and the transfer chamber 11.

The load lock chamber 12 has a door 12a at an end wall thereof, capable of being opened as well as vacuum-sealed. The transfer chamber 11 is air-tightly connected to the load lock chamber 12 through an opening 12d at the other end of the load lock chamber 12, and to the reaction chamber 13 through an opening 13d. Details of the reaction chamber 13 will be described later.

In the transfer chamber 11, there is provided transfer means to transfer the supporting means carrying a wafer on it from the load lock chamber 12 to the reaction chamber 13 or vice versa. The supporting means has the lid 15, a susceptor 17 on which the wafer 37 is placed, a connecting rod 16 connecting the sesceptor 17 to the lid 15. Details of the transfer means will be described later. The lid 15 serves both for vacuum-sealing the opening 12d or 13d and as a base for holding a susceptor 17 by a connector rod 16. On the lid 15 there is further provided a detachable liner tube 14 surrounding the wafer 37. In FIG. 2, broken lines show the supporting means and the liner tube 14 which are half inserted into the load lock chamber 12. Description about the liner tube 14 will be given later in detail. The other side of the lid 15 is attached to a transfer member 18. An O-ring 12e is provided between the lid 15 and the wall around the opening 12d of the transfer chamber 11, against which the lid 15 is pressed to provide a vacuum-sealing. When the door 12a is open, the opening 12 has been sealed by the lid 15 so that foreign gases from the open air area can not invade the transfer chamber 11, and the susceptor 17 is in a position ready to receive a wafer 37 thereon Through the opened door 12a, wafers are inputted from the outside onto the susceptor 17, or outputted therefrom.

The load lock chamber 12 has a gas inlet 12b and a gas outlet 21. After wafers 17 are inputted through the opened door 12a and placed on the susceptor 17, the door 12a is closed and a vacuum pump 22 evacuates the load lock chamber 12 through the gas outlet 21 down to nearly $10^{-3}$ Torr, thus undesirable foreign gases therein are mostly removed. Next, the load lock chamber 12 is fed and filled with a pure clean nitrogen from an inert gas source (not shown in the figure) through the gas inlet 12b up to approximately one atmospheric pressure. The load lock chamber 12 is opened when the lid 15 is pulled by a transfer means 18 along the arrow mark I into the transfer chamber 11.

In the transfer chamber 11 is always flowing a pure nitrogen gas having approximately one atmospheric pressure fed from gas inlets 11a and drained from gas outlets 11b, thus the inside of the transfer chamber is never exposed to the undesirable gases of the outside. The supporting means carrying the wafers thereon is pulled out. The dotted lines in FIG. 2 illustrate the lid 15 and the liner tube 14 now moving toward the transfer chamber, but the relationship of the lid 15 shown by the dotted lines to the transfer means is omitted for the sake of simplicity.

As shown in FIGS. 2 and 3, the transfer means includes a pair of rails 19a parallel to the axes of the reaction chamber 13 and the load lock chamber 12; another pair of rails 19b orthogonal to the first pair of the rails 19a; two lead screws 19c and 19d each parallel to the each pair of the rails 19a and 19b respectively; a transfer member 18 which holds the lid 15 and is held by the second transfer member 20a; the second transfer member 20a which is slidable on the rails 19a driven by the turning lead screw 19c; and the second transfer member 20b which holds the rails 19a and the lead screw 19c at their both ends respectively and slidable on the rails 19b driven by the turning lead screw 19d. Each transfer member 20a and 20b has nut means (not shown in the figures) for engaging with respective lead screw 19c and 19d. Motors for turning the screws 19a and 19d respectively are also included in the transfer means but not shown in the figures.

The second transfer member 20b carrying rails 19a, the lead screw 19c, the transfer member 20a, the supporting means, liner tube 14 and wafers 17 is moved sliding on the second rails 19b driven by the lead screw 19d along the arrow mark II toward the front of the opening 13d of the reaction chamber 13. The wafers 37 together with the liner tube 14 are inserted into the reaction chamber 13 driven by the turning lead screw 19c sliding on the rails 19a along the arrow mark III until the lid 15 seals the opening 13d of the reaction chamber 13. An O-ring 13e is provided between the lid 15 and the wall of the reaction chamber 13 around the opening 13d to keep sealing.

Until the opening 13d is sealed by the lid 15, the inert gas in the reaction chamber 13 is kept flowing into the transfer chamber 11, for preventing a gas flow into the reaction chamber 13 from the transfer chamber 11 whose contents gases are not fully pure and clean compared with those of the reaction chamber 13.

Reaction chamber 13 is made of a quartz tube having an inner diameter a little larger than the outer diameter of the liner tube 14, and provided with a gas inlet 13b on the end wall and a gas outlet 13c near the opening 13d.

The liner tube 14, also made of quartz, is provided in order to protect the inner surface of the reaction chamber 13 from undesirable deposition of materials produced by the MOCVD reaction Because, even though the contents ratio of the MOCVD reaction gases is controlled precisely, it is varied by those unexpected deposition existing within the reaction chamber 13 causing uncontrollable effects on the characteristics of the grown epitaxial layer. Therefore, the inside of the reaction chamber must be cleaned up very often. However, because of the structure of the reaction chamber 13 that has the transfer chamber 11 in front of its entrance opening 13d, the cleaning operation is difficult. So, this liner tube 14 is additionally provided within the reaction chamber 13 for shielding the deposition onto the reaction chamber. One end 14' of the liner tube 14 reaches an end wall of the reaction chamber 14. On this end wall a gas inlet 13b is located, such that the fed gas therefrom can smoothly enter inside the liner tube 14. And also, near another end of the liner tube 14 connected to the lid 15 a hole 13g is provided on the tube in front of the gas outlet 13c of the reaction chamber 13, such that the fed MOCVD reaction gases can flow through the liner tube 14. The gap between the outer surface of the liner tube 14 and the inner surface of the reaction chamber 13 is the narrower the better, so that the reaction gas can not easily flow through this gap easily. Because the MOCVD reaction gas in the gap may be pyrolized to deposit on the inner surface of the reaction chamber. Thus, the inner surface of the reaction chamber 14 is protected from undesirable deposition of semiconductor materials. Moreover, the liner tube 14 is detachably attached to the lid 15 at an end of the tube 14 by mounting means (not shown in the figures), and can be replaced with a clean washed liner tube very easily through the door 12a of the load lock chamber 12. As the result, the maintenance of the reaction chamber becomes easy.

After the opening 13d is sealed, the MOCVD process in the reaction chamber 13 is performed like a similar manner to the conventional one. For the preparation cycle of the MOCVD reaction, a clean purified nitrogen gas is fed from the nitrogen gas source (not shown in the figure) through the gas inlet 13b into the reaction chamber 13, and drained through the gas outlet 13c. The fed nitrogen gas is switched to a purified clean hydrogen gas fed from a hydrogen gas source (not shown in the figure). This hydrogen gas serves as a carrier gas of the MOCVD source gas (reaction gas). In addition to the hydrogen gas, arsine gas ($AsH_3$), a source of arsenic, is fed from an arsine gas source (not shown in the figure) through the same gas inlet 13b. The susceptor 17 and the wafers 37 are heated by the radio frequency coil 13a up to specific reaction temperature, such as 700°-800° C. Specific gas of MOCVD, a source of metal atom, for example, TMA or TMG is further additionally fed from each source (not shown in the figure) through the same gas inlet 13b. The flow of these gases are precisely controlled by mass flow controllers (not shown in the figure) These fed gases are pyrolyzed by the heat of the wafers 37 and susceptor 17 to supply metal atoms to the wafers, to grow an epitaxial crystal layer of compound semiconductor on the wafers.

After the process of the epitaxial growth is completed, the temperature of the wafers is lowered down to about 300° C. Supply of the arsine gas is still continued until the temperature falls down to this value, so that the arsenic already been compound in the crystal may not go out again. The arsine gas in the reaction chamber 13 is replaced by a clean purified hydrogen gas fed therein. Then, the fed hydrogen gas is switched to purified nitrogen gas.

The liner tube 14, the supporting means carrying the wafer thereon are pulled out of the reaction chamber 13 into the transfer chamber 11 by the transfer means, thus returned back into the load lock chamber 12 driven by the transfer means along the rails 19b and 19a. The opening 12d of the load lock chamber 12 is sealed by the lid 15 again. The load lock chamber 12 is evacuated by the vacuum pump 22 through gas outlet 21, so that gases of MOCVD absorbed or adsorbed by the susceptor 17 are removed After this evacuation, the load lock chamber 12 is filled with nitrogen gas, then the door 12a is opened to output the wafers 37. Like a manner described above, one cycle of MOCVD process on a wafer is completed.

Four gas inlets 11a are provided at each corner near or on the wall to which the reaction chamber 13 and the load lock chamber 12 are connected. Four gas outlets 11b are provided at each corner near or on the wall of the opposite side to the gas inlets 11a. This layout of the gas inlets and gas outlets generates a flow of gas flowing from the reaction chamber side toward the opposite side in the transfer chamber 11. The gas flow of this direction, in cooperation with the gas flow coming out of the reaction chamber 13 prevents a gas flow flowing from the transfer chamber into the reaction chamber 13, thus preventing the foreign gas invasion into the reaction chamber 13.

In order to keep better isolation between the adjacent chambers, shutter means 12f for sealing the opening 12d of the load lock chamber 12 and another shutter means 13f for sealing the opening 13d of the reaction chamber 13 may be provided in the transfer chamber 11, as illustrated by dotted lines in the FIG. 2. These shutters means are used for sealing the opening respectively, while the lid 15 is absent from an opening for moving or for sealing another opening, to prevent an invasion of foreign gases into the transfer chamber 11 or into the reaction chamber 13 respectively. These shutter means are of ordinary hinged type door driven for opening and closing by a driving mechanism (not shown in the figures).

As above described, the inside of the transfer chamber 11 is never exposed to the gases from the outside and kept clean owing to the load lock chamber 12, continuous flow of clean nitrogen gas, the lid 15 and shutter 12f and 13f. Thus, undesirable foreign gases are all washed away while the wafers are moving through the transfer chamber.

Gases drained or exhausted from the reaction chamber 13, the transfer chamber 11 and the load lock chamber 12 are all collected and processed for removing poisonous contents, for example arsenic (the apparatus thereof is not shown in the figure) to avoid an environmental hazard.

While only a single reaction chamber and only a single load lock chamber are shown in the above described embodiment as a representative of each, however, plurality of each may be connected to a single transfer chamber Plurality of the load lock chambers can reduce waiting time for MOCVD processing. Plurality of the reaction chambers can reduce waiting time for operating load lock chamber. Reduction of the waiting time apparently results in an efficient fabrication by the MOCVD.

In the above-described transfer means, rails 19b are used for traversingly locating the supporting means carrying the wafers 37 thereon against a selected chamber, such as the reaction chamber 13. However, in place of the rails 19b of linear motion, rotating means which holds the supporting means and is capable of rotating around a vertical axle (not shown in the figure), may be employed for selecting a chamber. In this structure, the reaction chambers and load lock chambers are accordingly located radiately around the same axle. Although only two embodiments of transfer means have been disclosed and described, it is apparent that other embodiments and modification are possible.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. Apparatus of metal organic chemical vapor deposition for growing an epitaxial layer of compound semiconductor on a semiconductor wafer, comprising:
    support means for supporting the wafer, including:
        a susceptor receiving the wafer;
        a connecting rod, having first and second ends, the first end being connected to said susceptor; and
        a lid connected to the second end of said connecting rod;
    a reaction chamber effecting said MOCVD process therein including:
        a first gas inlet introducing gases for MOCVD processing into said reaction chamber; and
        a first gas outlet draining said gases;
    load lock chamber means for loading and unloading the wafer into and from said reaction chamber, respectively, said load lock chamber means including;
        a second gas inlet allowing introduction of an inert gas into said load lock chamber means,
        a second gas outlet allowing evacuation of said load lock chamber means;
        an evacuation pump evacuating said load lock chamber means through said second gas outlet; and
        a doorway through which said wafer is input or output, said doorway being vacuum-sealable; and
    a transfer chamber provided between said reaction chamber and said load lock chamber means and including:
        a third gas inlet allowing introduction of an inert gas into said transfer chamber;
        a third gas outlet allowing drainage of the inert gas from said transfer chamber so that said transfer chamber is continuously replenished by the inert gas introduced through said third gas inlet and drained through said third gas outlet;
        a first opening connecting said transfer chamber to said load lock chamber means, through which said wafer is input to or output from said transfer chamber and being vacuum-sealable by said lid;
        a second opening connecting said transfer chamber to said reaction chamber, through which said wafer is input to or output from said reaction chamber and being vacuum-sealable; and
        transfer means for transferring said supporting means from said load lock chamber into said reaction chamber and from said reaction chamber into said load lock chamber, said transfer chamber being fed and filled with an inert gas, preventing the invasion of foreign gas from the outside into said reaction chamber.

2. An apparatus according to claim 1, further comprising:
    a liner tube, one end of which is detachably attached to said lid, insertable into said load lock chamber and said reaction chamber and transferred between said load lock chamber and said reaction chamber by said transfer means together with said supporting means, and enclosing said susceptor and said wafer, protecting the inner surface of said reaction chamber from deposition of materials caused by said MOCVD reaction.

3. An apparatus according to claim 1, further comprising first shutter means for vacuum-sealing said first opening while said susceptor is no in said load lock chamber.

4. An apparatus according to claim 3, further comprising second shutter means for vacuum-sealing said second opening while said susceptor is not in said reaction chamber.

5. An apparatus according to claim 2, wherein said reaction chamber includes an end wall and said liner tube has a side wall, is made of quarts, has an axial length to reach the end wall of said reaction chamber when said lid seals said second opening, has an outer diameter allowing insertion into said reaction chamber, and has a hole in the side wall positioned close to said first gas outlet when said liner tube is positioned adjacent to said lid, and said end wall of the reaction chamber has said first gas inlet thereon, such that gas introduced into said reaction chamber via said first gas inlet easily flows through the liner tube.

6. An apparatus according to claim 1, further comprising:
a liner tube, one end of which is detachably attached to said lid, insertable into said load lock chamber and said reaction chamber and transferred between said load lock chamber and said reaction chamber by said transfer means together with said supporting means, and enclosing said susceptor and said wafer protecting the inner surface of said reaction chamber from deposition of materials caused by said MOCVD reaction.

7. An apparatus according to claim 6, further comprising first shutter means for vacuum-sealing said first opening while said susceptor is not in said load lock chamber.

8. An apparatus according to claim 7, further comprising second shutter means for vacuum-sealing said second opening while said susceptor is not in said reaction chamber.

9. An apparatus according to claim 6, wherein said reaction chamber includes an end wall and said liner tube has a side wall, is made of quartz, has an axial length to reach the end wall of said reaction chamber when said lid seals said second opening, has an outer diameter allowing insertion into said reaction chamber, and has a hole in the side wall (positioned) close to said first gas outlet when said liner tube is positioned adjacent to said lid, and said end wall of the reaction chamber has said first gas inlet thereon, such that gas introduced into said reaction chamber via said first gas inlet easily flows through the liner tube.

10. An apparatus according to claim 1, further comprising first shutter means for vacuum-sealing said first opening while said susceptor is notiin said load lock chamber.

11. An apparatus according to claim 10, further comprising second shutter means for vacuum-sealing said second opening while said susceptor is no in said reaction chamber.

12. An apparatus according to claim 2, further comprising first shutter means for vacuum-sealing said first opening while said susceptor is not in said load lock chamber.

13. An apparatus according to claim 12, further comprising second shutter means for vacuum-sealing said second opening while said susceptor is not in said reaction chamber.

14. Apparatus of netal organic chemical vapor deposition (MOCVD) for growing an epitaxial layer of compound semiconductor on a semiconductor wafer comprising:
supporting means including:
a susceptor for receiving the wafer thereon;
a connecting rod having first and second ends, the first end being connected to said susceptor; and
a lid connected to the second end of said connecting rod;
a reaction chamber for effecting said MOCVD process therein, including:
a first gas inlet for introducing processing gas for MOCVD processing into said reaction chamber; and
a first gas outlet for draining the processing gas;
an evacuable load lock chamber for loading and unloading the wafer into and from said reaction chamber, said load lock chamber including:
a second gas inlet for introducing an inert gas into said load lock chamber;
a second gas outlet for evacuating said load lock chamber;
an evacuation pump for evacuating said load lock chamber through said second gas outlet;
a vacuum sealable door leading to an open-air area, through which the wafer passes;
a transfer chamber provided between said reaction chamber and said load lock chamber, and including:
a third gas inlet for introducing inert gas into said transfer chamber;
a third gas outlet for draining gas therein;
a first opening for connecting said transfer chamber to said load lock chamber, the wafer being input into said transfer chamber from said load lock chamber as well as output from said transfer chamber to said load lock chamber through said first opening, said first opening being capable of being opened as well as vacuum-sealed by said lid while said load lock chamber is evacuated as well as while said door is open;
a second opening for connecting said transfer chamber to said reaction chamber, the wafer being input from said transfer chamber into said reaction chamber as well as output from said reaction chamber into said transfer chamber, through said second opening, said second opening being capable of being opened as well as vacuum-sealed; and
transfer means for transferring said supporting means from said load lock chamber in too said reaction chamber and from said reaction chamber into said load lock chamber;
a liner tube, one end of which is detachably attached to said lid, said liner tube capable of being inserted into said load lock chamber as well as said reaction chamber, said liner tube being transferred between said load lock chamber and said reaction chamber by said transfer means together with said supporting means, and said liner tube enclosing said susceptor and said wafer on it, whereby said transfer chamber is fed and filled with an inert gas, preventing the invasion of foreign gas from the outside into said reaction chamber and whereby the inner surface of said reaction chamber is protected from deposition of materials caused by said MOCVD reaction.

15. An apparatus according to claim 14, wherein said liner tube comprises quartz, has an axial length to reach an end wall of said reaction chamber when said lid seals said second opening of said reaction chamber, has an outer diameter capable of being inserted easily into said reaction chamber, and has a hole opened in the side wall of said liner tube and close to said gas outlet of said reaction chamber when said liner tube is positioned by said lid which is then sealing said second opening, and said end wall of the reaction chamber has said gas inlet thereon, such that fed gas easily flows through inside the liner tube.

16. An apparatus according to claim 14, further comprising first shutter means for vacuum-sealing said first opening while said susceptor is not in said load lock chamber.

17. An apparatus according to claim 16, further comprising second shutter means for vacuum-sealing said second opening while said susceptor is not in said reaction chamber.

18. Apparatus of metal organic chemical vapor deposition (MOCVD) for growing an epitaxial layer of compound semiconductor on a semiconductor wafer comprising:
  a supporting means including:
    a susceptor for receiving the wafer thereon;
    a connecting rod having first and second ends, the first end being connected to said susceptor; and
    a lid connected to the second end of said connecting rod;
  a reaction chamber for effecting said MOCVD process therein including:
    a first gas inlet for introducing processing gas for MOCVD processing into said reaction chamber; and
    a first gas outlet for draining the processing gas;
  an evacuable load lock chamber for loading and unloading the wafer into and from said reaction chamber, said load lock chamber including:
    a second gas inlet for introducing an inert gas into said load lock chamber;
    a second gas outlet for evacuating said load lock chamber;
    an evacuation pump for evacuating said load lock chamber through said second gas outlet;
    a vacuum sealable door leading to an open-air area, through which the wafer passes;
  a transfer chamber provided between said reaction chamber and said load lock chamber, and including:
    a third gas inlet for introducing inert gas into said transfer chamber;
    a third gas outlet for draining gas therein;
    a first opening for connecting said transfer chamber to said load lock chamber, the wafer being input into said transfer chamber from said load lock chamber through said first opening, said first opening being capable of being opened as well as vacuum-sealed by said lid while said load lock chamber is evacuated as well as while said door is open;
    a second opening for connecting said transfer chamber to said reaction chamber, the wafer being input from said transfer chamber into said reaction chamber as well as output from said reaction chamber into said transfer chamber, through said second opening, said second opening being capable of being opened as well as vacuum-sealed; and
  transfer means for transferring said supporting means from said load lock chamber into said load lock chamber, said transfer chamber being fed and filled with an inert gas, preventing the invasion of foreign gas into said reaction chamber and said transfer chamber being refreshed by said inert gas coming from said third gas inlet and going out through said third gas outlet; and
  a liner tube, one end of which is detachably attached to said lid, said liner tube insertable into said load lock chamber as well as said reaction chamber, said liner tube transferable between said load lock chamber and said reaction chamber by said transfer means together with said supporting means, said liner tube enclosing said susceptor and said wafer on it, protecting the inner surface of said reaction chamber from deposition of materials caused by said MOCVD reaction.

19. An apparatus according to claim 18, further comprising a first shutter means for sealing said first opening while the susceptor is not in said load lock chamber.

20. An apparatus according to claim 19, further comprising second shutter means for sealing said second opening while the susceptor is not in said reaction chamber.

21. An apparatus according to claim 6, wherein said liner tube is made of quartz, has an axial length to reach an end wall of said reaction chamber when said lid seals said second opening of said reaction chamber, has an outer diameter capable of being inserted easily into said reaction chamber, and further, said liner tube has a hole opened in the side wall of said liner tube and close to said gas outlet of said reaction chamber when said liner tube and close to said gas outlet of said reaction chamber when said liner tube is positioned by said lid which is then sealing said second opening, and said end wall of the reaction chamber has said gas inlet thereon, such that said fed gas easily flows through inside the liner tube.

22. An apparatus according to claim 1, wherein said gases for MOCVD processing introduced into said reaction chamber include Tri-Methyl-Aluminum and Tri-Methyl-Gallium.

23. A metal organic chemical vapor deposition (MOCVD) apparatus, for processing a semiconductor wafer, comprising:
  reaction chamber means for effecting said MOCVD process;
  evacuable and sealable load lock chamber means for loading and unloading the wafer into and from said reaction chamber; and
  transfer chamber means for transferring the wafer to and from said reaction chamber means and said load lock chamber means, said transfer chamber means being supplied with a constant flow of input gas to cleanse the wafer and transfer chamber means of contaminants;

* * * * *

UNITED STATES PATENT AND TRADEMARK OFFICE
CERTIFICATE OF CORRECTION

PATENT NO. : 4,883,020
DATED : November 28, 1989
INVENTOR(S) : Kazumi Kasai et al.

It is certified that error appears in the above-identified patent and that said Letters Patent is hereby corrected as shown below:

```
Col.  4, line 49, "12" should be --12d--.
Col.  8, line 11, "tion for" should be --tion (MOCVD)
                  for--.
Col.  9, line 16, "quarts" should be --quartz--;
         line 59, "notiin" should be --not in--;
         line 63, "no" should be --not--.

Col. 10, line 56, "in too" should be --into--.
Col. 11, line 63, "chamber through" should be
                  --chamber as well as output from said
                  transfer chamber to said load lock
                  chamber through--.
Col. 12, line 10, "said load" (second occurrence)
                  should be --said reaction chamber
                  and from said reaction chamber into
                  said load--;
         line 66, "contaminants;" should be
                  --contaminants.--.
```

Signed and Sealed this

Eighteenth Day of December, 1990

Attest:

HARRY F. MANBECK, JR.

*Attesting Officer*          Commissioner of Patents and Trademarks